United States Patent
Griffin et al.

(10) Patent No.: US 8,937,424 B2
(45) Date of Patent: Jan. 20, 2015

(54) STRAIN AMPLIFICATION STRUCTURE AND SYNTHETIC JET ACTUATOR

(75) Inventors: Steven F. Griffin, Kihei, HI (US); Shawn Haar, Kihei, HI (US)

(73) Assignee: The Boeing Company, Chicago, IL (US)

( * ) Notice: Subject to any disclaimer, the term of this patent is extended or adjusted under 35 U.S.C. 154(b) by 394 days.

(21) Appl. No.: 13/524,878

(22) Filed: Jun. 15, 2012

(65) Prior Publication Data

US 2013/0336820 A1    Dec. 19, 2013

(51) Int. Cl.
    H02N 2/04    (2006.01)
(52) U.S. Cl.
    CPC .................................. *H02N 2/043* (2013.01)
    USPC ....................................................... 310/328
(58) Field of Classification Search
    CPC ............ H02N 2/02; H02N 2/04; H02N 2/043
    USPC ....................................................... 310/328
    See application file for complete search history.

(56) References Cited

U.S. PATENT DOCUMENTS

| 4,769,569 | A |   | 9/1988 | Stahlhuth |
|---|---|---|---|---|
| 4,845,688 | A | * | 7/1989 | Butler ........................... 367/174 |
| 4,952,835 | A |   | 8/1990 | Stahlhuth |
| 5,729,077 | A |   | 3/1998 | Newnham et al. |
| 5,957,413 | A |   | 9/1999 | Glezer et al. |
| 6,291,928 | B1 |   | 9/2001 | Lazarus et al. |
| 6,294,859 | B1 |   | 9/2001 | Jaenker |
| 6,927,528 | B2 |   | 8/2005 | Barillot et al. |
| 7,748,664 | B2 |   | 7/2010 | Boespflug et al. |
| 2006/0119224 | A1 |   | 6/2006 | Keolian et al. |
| 2006/0125350 | A1 | * | 6/2006 | Audren et al. ................. 310/328 |
| 2008/0092354 | A1 |   | 4/2008 | Clingman et al. |
| 2009/0115292 | A1 |   | 5/2009 | Ueda et al. |
| 2011/0109198 | A1 |   | 5/2011 | Asada et al. |
| 2013/0234561 | A1 | * | 9/2013 | Moler ........................... 310/328 |

OTHER PUBLICATIONS

Newnham, R., Dogan, A., Xu, Q., Onitsuka, K., Tressler, J., and Yoshikawa, S., "Flextensional Moonie Actuators," 1993 IEEE Proceedings, Ultrasonics Symposium, vol. 1, Oct. 31-Nov. 3, 1993, pp. 509-513.

* cited by examiner

*Primary Examiner* — Derek Rosenau
(74) *Attorney, Agent, or Firm* — Felix L. Fischer

(57) ABSTRACT

A strain amplification structure has a frame with a hexagonal structure incorporating a plurality of rigid beams that are connected to opposing end beams by a plurality of flexible joints. A piezoceramic actuator assembly is connected to the opposing end beams having a collar including an opening. A shaft providing an output is connected to the plurality of rigid beams with flexible joints and passes through the opening in the collar for non-interfering motion orthogonal to the actuator assembly.

9 Claims, 9 Drawing Sheets

STRAIN AMPLIFICATION STRUCTURE AND SYNTHETIC JET ACTUATOR

BACKGROUND INFORMATION

1. Field

Embodiments of the disclosure relate generally to the field of synthetic jet actuators and more particularly to a mechanical amplifier actuation system with minimized translating mass for coupling of mechanical and acoustical amplification for creating a synthetic jet.

2. Background

Synthetic jets are being employed for control of flow on various aerodynamic surfaces. Boundary layer control for drag reduction to increase fuel efficiency and for aerodynamic controls on flight vehicles as well as turbulence reduction for improved aero-optical performance of electro-optical turrets have been demonstrated with synthetic jets.

The small size and high frequency operation of synthetic jets allows use of piezoelectric actuators for creation of pumping devices to create the jet. However, the small physical extension and contraction of piezoelectric devices requires amplification for enhanced operation. Various amplification systems have been employed for piezoelectric actuators. A basic flexible rombus structure such as flexure 2 shown in FIG. 1 has been employed to create amplified motion of a piezoelectric stack 3. Lateral motion of the piezoelectric stack as represented by arrows 4 results in longitudinal extension of the flexure as shown by arrow 5 with an amplification created by the flexure between a first vertex 6 and a second vertex 7 in the flexure. For driving a piston in a synthetic jet device, the flexure must be constrained at one vertex with motion output at the second vertex. As a result, the entire flexure including the contained piezoelectric stack with all associated electrical connections translates during activation.

It is therefore desirable to provide an amplification device for piezoelectric actuation which minimizes translational mass and to provide a synthetic jet with a maximized amplification transfer function.

SUMMARY

Embodiments disclosed herein provide a strain amplification structure having a frame with a hexagonal structure incorporating a plurality of rigid beams that are connected to opposing end beams by a plurality of flexible joints. A piezoceramic actuator assembly is connected to the opposing end beams having a collar including an opening. A shaft providing an output is connected to the plurality of rigid beams with flexible joints and passes through the opening in the collar for non-interfering motion orthogonal to the actuator assembly.

In an example application a synthetic jet actuation structure is created with an amplification structure frame having laterally spaced flexing end beams, a first pair of opposing actuation beams angularly extending from the end beams and a second pair of opposing actuation beams extending angularly from the end beams, parallel to and longitudinally spaced from the first pair of opposing actuation beams. A center shaft is suspended by the first pair of opposing actuation beams and the second pair actuation beams. A piezoceramic actuation assembly extends between the end beams in a non-interfering relationship with the center shaft. The piezoceramic actuation assembly has a first condition placing the end beams in a first relative lateral position with the first and second pair of actuation beams extending at a first angle from the end beams to place the shaft in a first longitudinal position and a second condition placing the end beams in a second relative lateral position with the first and second pair of actuation beams extending at a second angle from the end beams to place the shaft in a second longitudinal position. A piston is connected to the center shaft and a housing having a cavity receives the piston. An orifice provides an output from the cavity to create a synthetic jet upon reciprocation of the piezoceramic actuation assembly between the first and second condition.

The embodiments disclosed provide a method for creating a synthetic jet by interconnecting laterally spaced flexing end beams with a first pair of opposing actuation beams angularly extending from the end beams and a second pair of opposing actuation beams extending angularly from the end beams, parallel to and longitudinally spaced from the first pair of opposing actuation beams. A center shaft with a piston is suspended from the first pair of opposing actuation beams and the second pair actuation beams. A piezoceramic actuation assembly connected between the end beams and intermediate the first and second pair of actuation beams is reciprocated on a non-interfering basis with the center shaft. The piston is received in a housing cavity having an orifice to create the synthetic jet.

The features, functions, and advantages that have been discussed can be achieved independently in various embodiments of the present disclosure or may be combined in yet other embodiments further details of which can be seen with reference to the following description and drawings.

DETAILED DESCRIPTION

Embodiments disclosed herein provide a strain amplification structure. The structure includes a rhombus-like hexagonal frame or flexure. The frame incorporates a plurality of rigid beams connected together by flexible joints. A pair of piezoceramic stack actuators such as Lead Zirconate Titanate (PZT), internal to the frame, act against the frame causing the frame to change from an undeflected state to a deflected state. A shaft connecting an attachment point to an output extends through an aperture in a base that is common to the pair of PZT stack actuators. The shaft can be used to drive a variety of devices such as a pump for a synthetic jet application.

Figure 1:
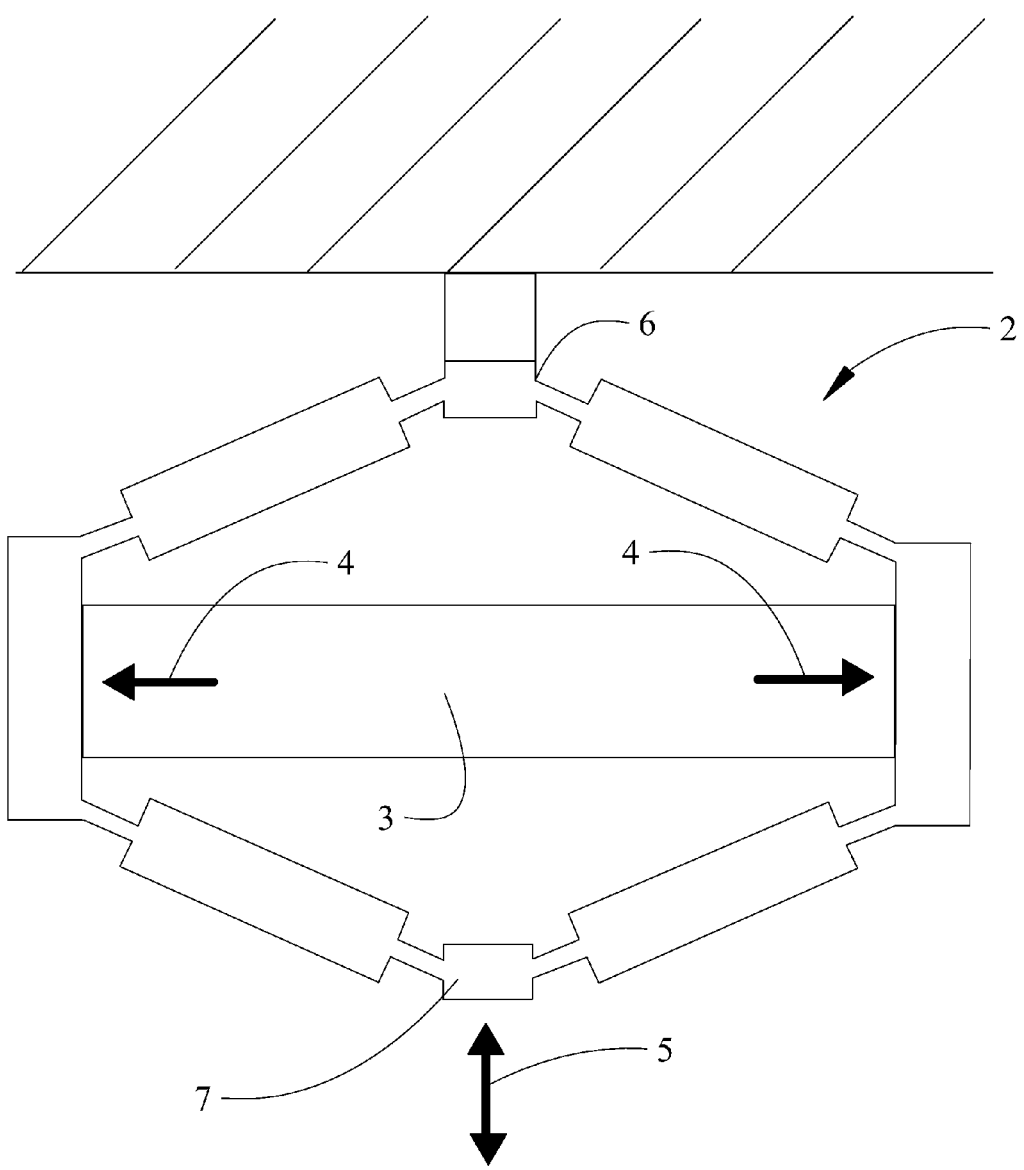
FIG. 1 is a schematic side view of a prior art piezoelectric amplification structure.
Figure 2:
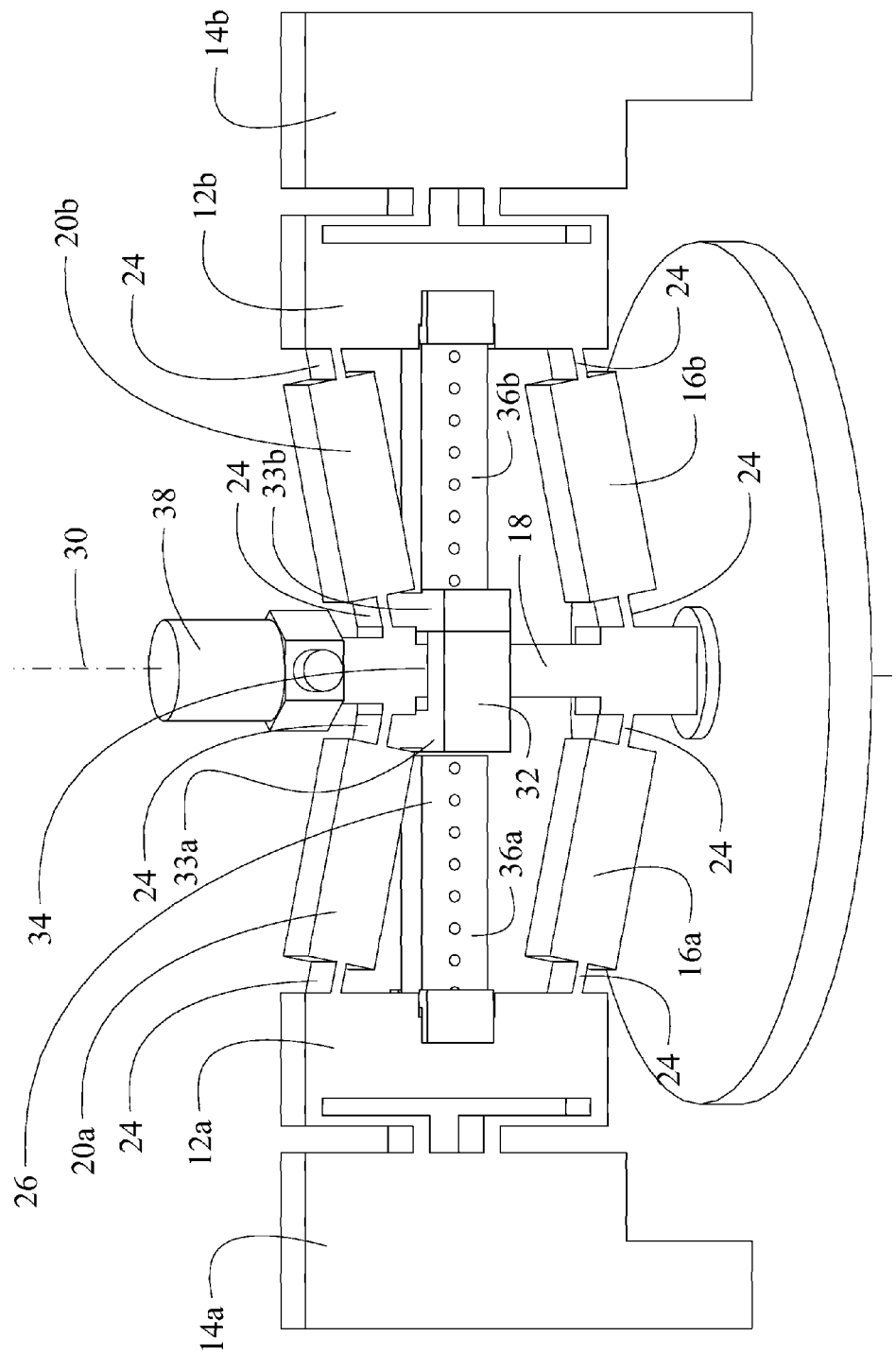
FIG. 2 is pictorial view of an embodiment of a mechanical amplification system for piezoceramic stacks for a synthetic jet.
Figure 3:
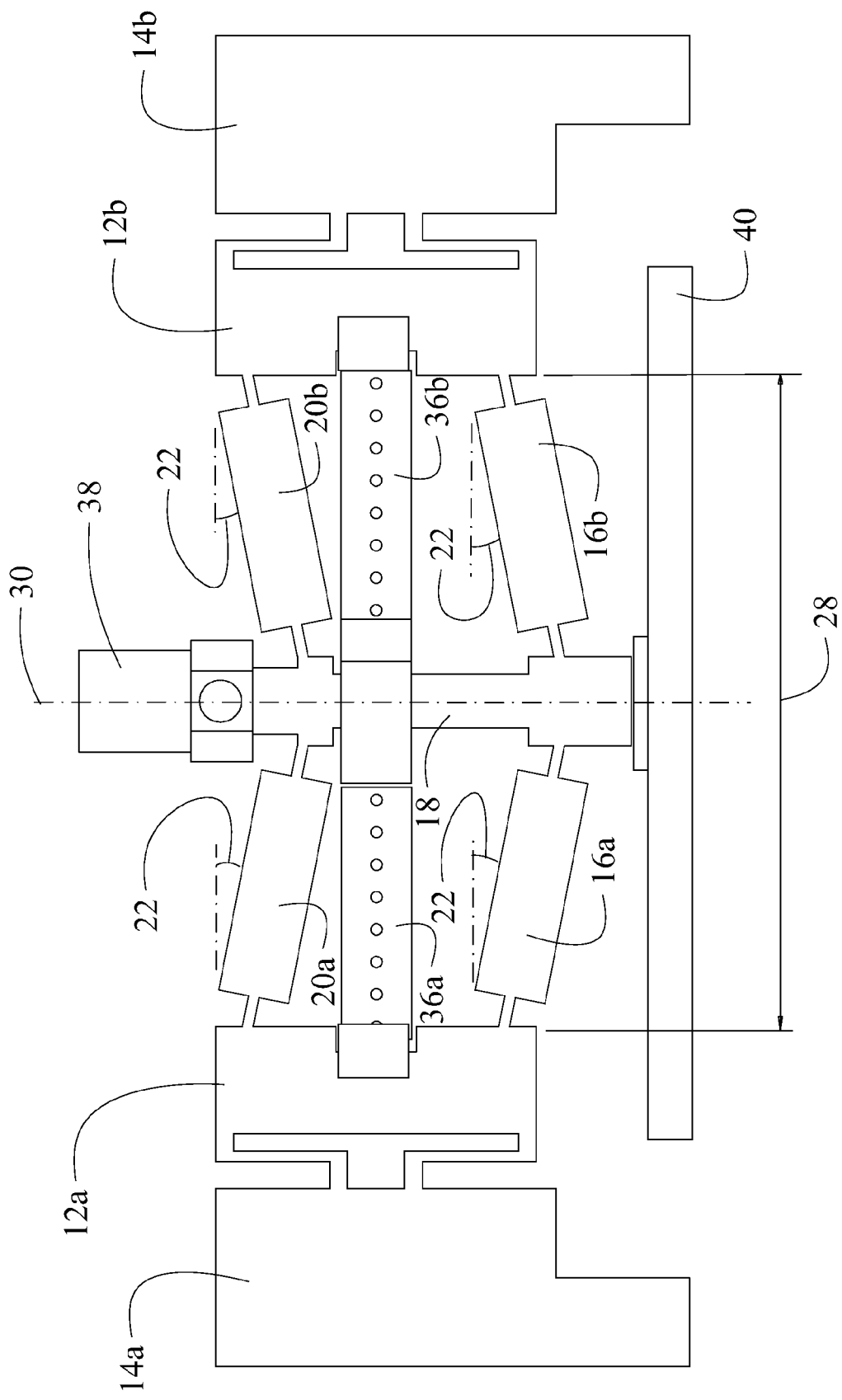
FIG. 3 is a side view of the embodiment of FIG. 2.

Referring to the drawings, FIGS. 2 and 3 show an embodiment of an amplification structure frame 10. Laterally spaced flexing end beams 12a and 12b support the structure from attachment brackets 14a and 14b which may be attached to a rigid support for the entire amplification structure frame in applications such as a synthetic jet as will be described in greater detail subsequently. A first pair of opposing actuation beams 16a and 16b extend angularly from the end beams 12a and 12b, respectively, to suspend a center shaft 18. A second pair of actuation beams 20a and 20b, which are spaced longitudinally from the first actuation beam pair 16a, 16b, extend angularly from the end beams 12a and 12b to the center shaft 18. Actuation beams 20a and 20b are parallel to actuation beams 16a and 16b, extending from the end beams 12a and 12b at the same relative extension angle 22 (best seen in FIG. 3). The actuation beams are interconnected to the end beams and center shaft with flexible joints 24. For the embodiment shown, the joints 24 are flexible webs machined or etched between the end beams and actuation beams and the center shaft and actuation beams. In alternative embodiments, pinned connections may be employed. The components of the amplification structure frame 10 may be fabricated from aluminum (an example embodiment employs 2024 aluminum), titanium, beryllium or beryllium alloys such as beryllium copper, steel or carbon fiber reinforced plastics.

A piezoceramic actuation assembly 26 extends between the end beams 12a and 12b centered intermediate the first pair of actuation beams 16a, 16b and second pair of actuation beams 20a, 20b. Activation of piezoelectric elements in the actuation assembly 26 provides lateral extension or contraction of the assembly which, in turn increases or decreases the lateral distance 28 between the end beams. An increase in the lateral distance of the end beams results in a reduction in the extension angle 22 of the actuation beam pairs while a decrease in the lateral distance results in an increase in the extension angle. The varying extension angle of the actuation beam pairs creates longitudinal motion of the center shaft 18 along axis 30 with an amplification of the relative distance based on the variation of the extension angle 22.

The piezoceramic actuation assembly 26 operates orthogonally to the center shaft 18 on a non-interference basis. For the embodiment shown in FIGS. 2 and 3, this is accomplished with a collar 32 having an aperture 34 through which the center shaft 18 extends. Two piezoceramic stacks 36a and 36b extend oppositely from the collar 32 to the end beams 12a and 12b. Collar 32 in the embodiment shown in the drawings surrounds the center shaft 18 with interlocking elements 33a and 33b. In alternative embodiments, a collar in the form of a U or semi-cylindrical element which partially surrounds the shaft may be employed. The collar may additionally provide a clearance for the shaft in aperture 34, as for the embodiment shown, or closely receive the shaft to act as a guide element to limit shaft lateral deflection. In other alternative embodiments, the piezoceramic actuation assembly may employ a single piezoceramic stack which extends from the end beams through a slot in the center shaft. In any of the embodiments, the attachment brackets may be rigidly mounted to a structure and the piezoceramic actuation assembly is maintained in a stationary position while the center shaft is translated longitudinally. This structure significantly reduces the moving mass allowing a higher translation frequency for the shaft 18 to be created by the amplification structure frame 10.

Figure 4:
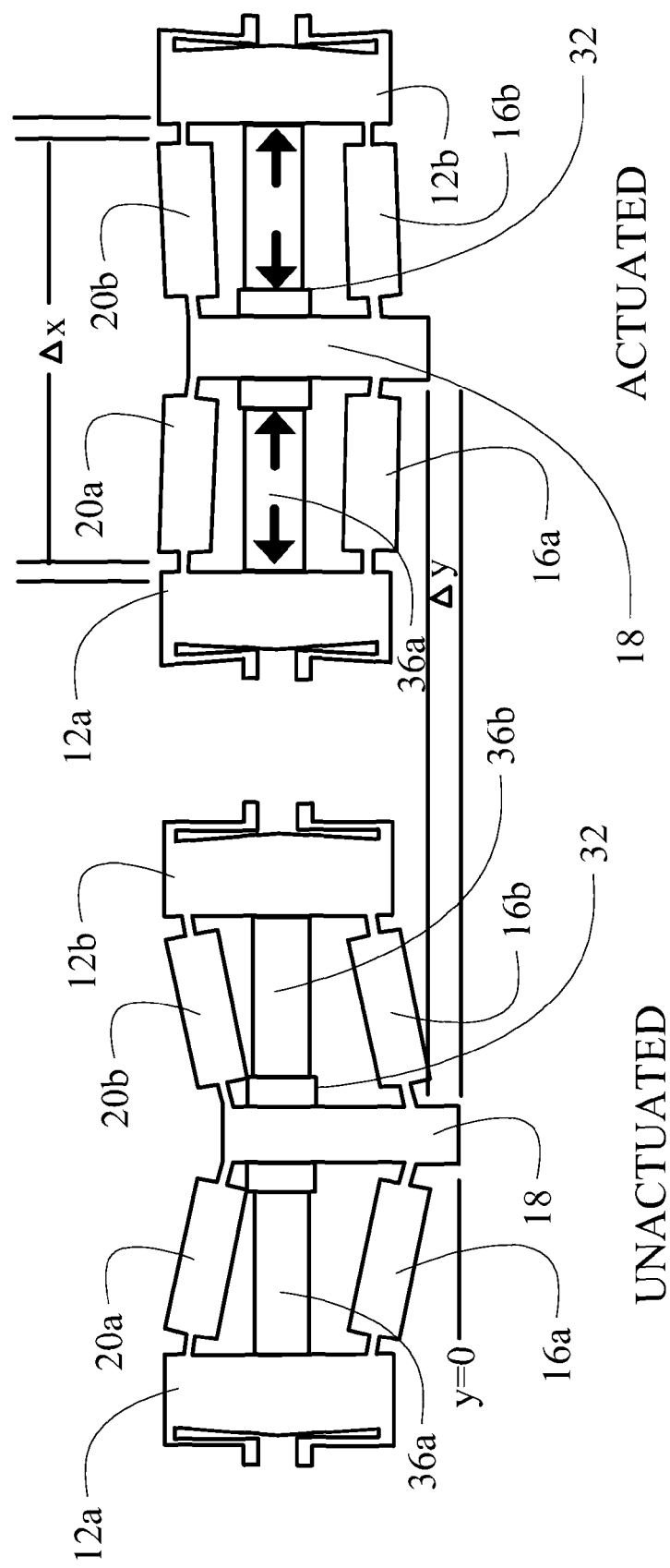
FIG. 4 is a schematic representation of an unextended position of the amplification system and an extended position of the amplification system.

As shown in FIG. 4, the unactuated amplification structure frame 10a with piezoceramic stacks 36a and 36b in a relaxed or contracted state places the end beams 12a, 12b in closest proximity with the actuation beam pairs 16a, 16b and 20a, 20b at a maximum extension angle. Center shaft 18 is placed by the actuation beams at an initial longitudinal end point designated Y=0. The actuated amplification structure frame 10b with piezoceramic stacks 36a and 36b in an activated or extended state as represented by arrows 38 urges the end beams laterally outward a distance $\Delta X$ which reduces the extension angle of the actuation beam pairs approaching perpendicularity to the end beams resulting in a longitudinal motion of the center shaft 18 of $\Delta Y$. The center shaft translates through the collar 32 allowing the piezoceramic actuation assembly to remain longitudinally static.

Figure 5:
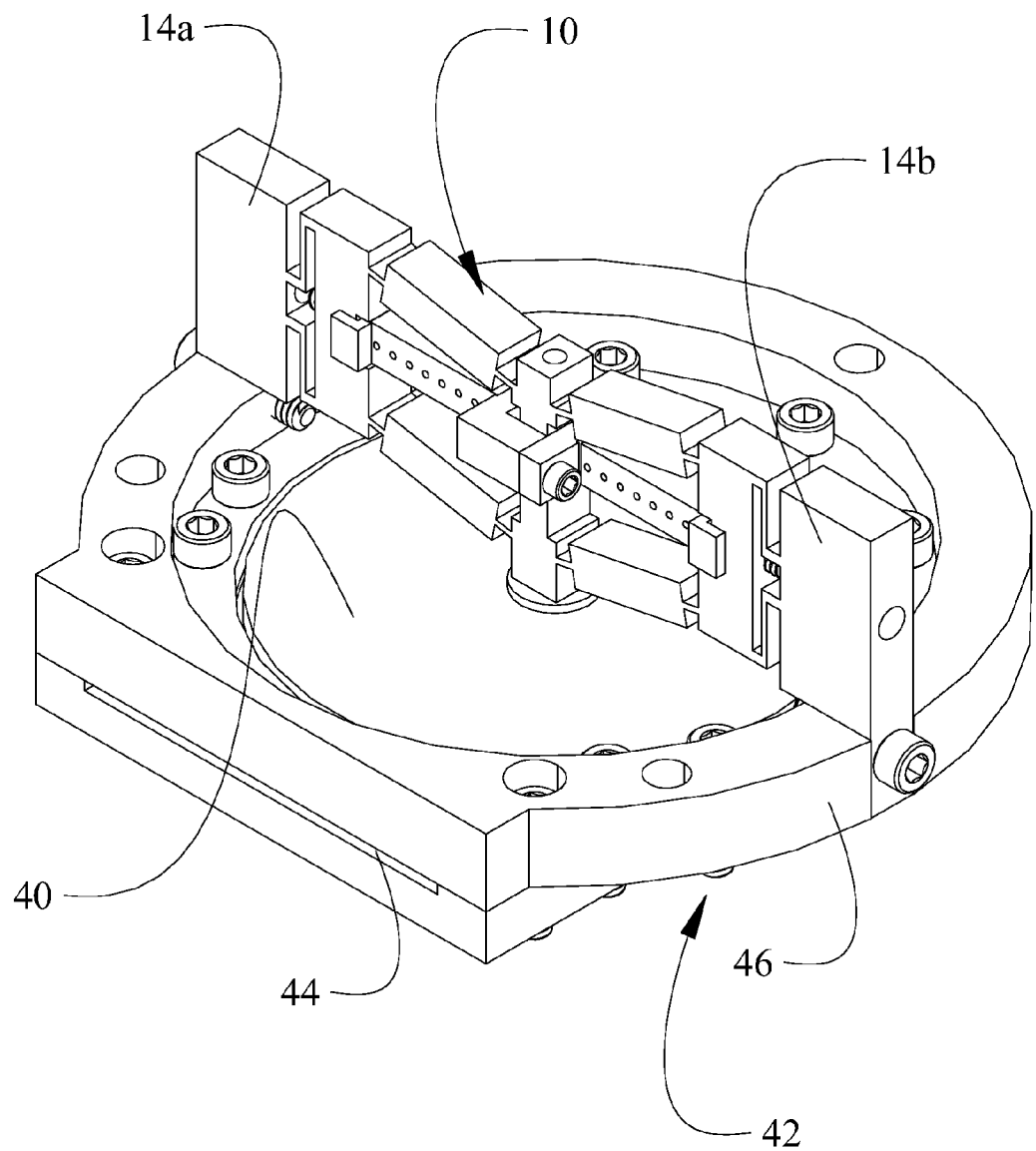
FIG. 5 is a pictorial view of an exemplary synthetic jet employing the amplification system embodiment of FIG. 2.
Figure 6:
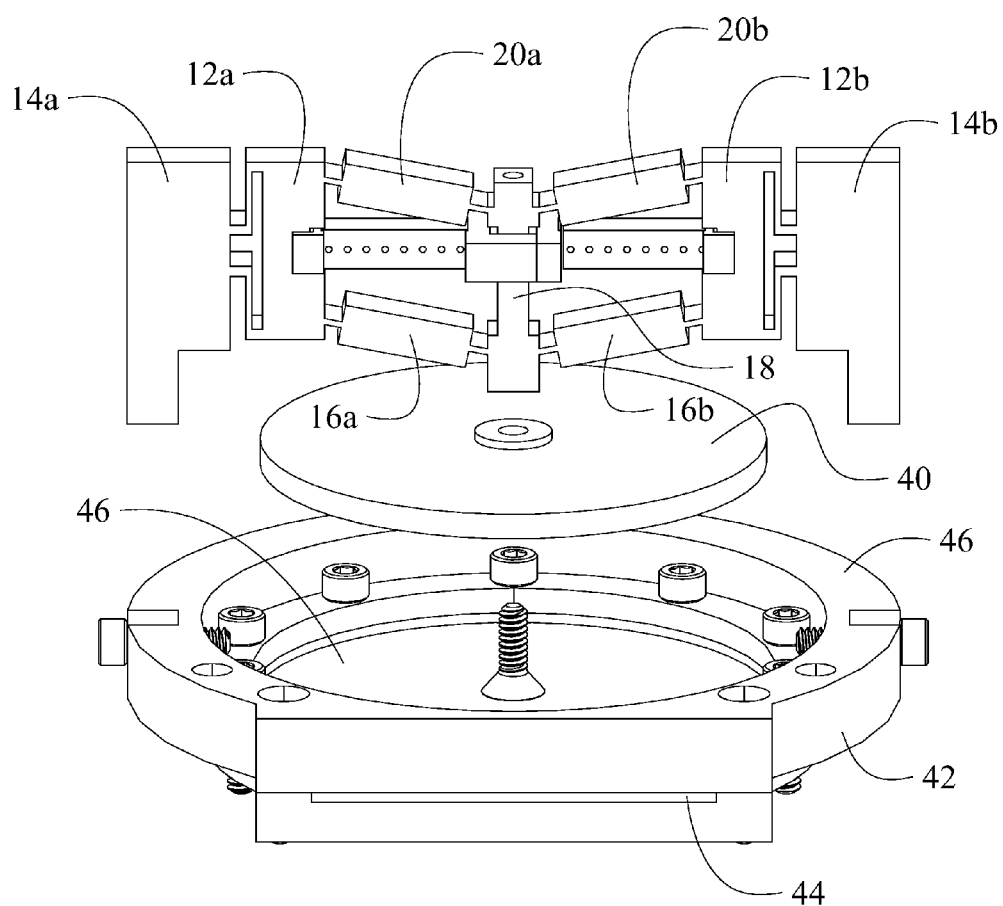
FIG. 6 is an exploded view of the synthetic jet of FIG. 5.
Figure 7:
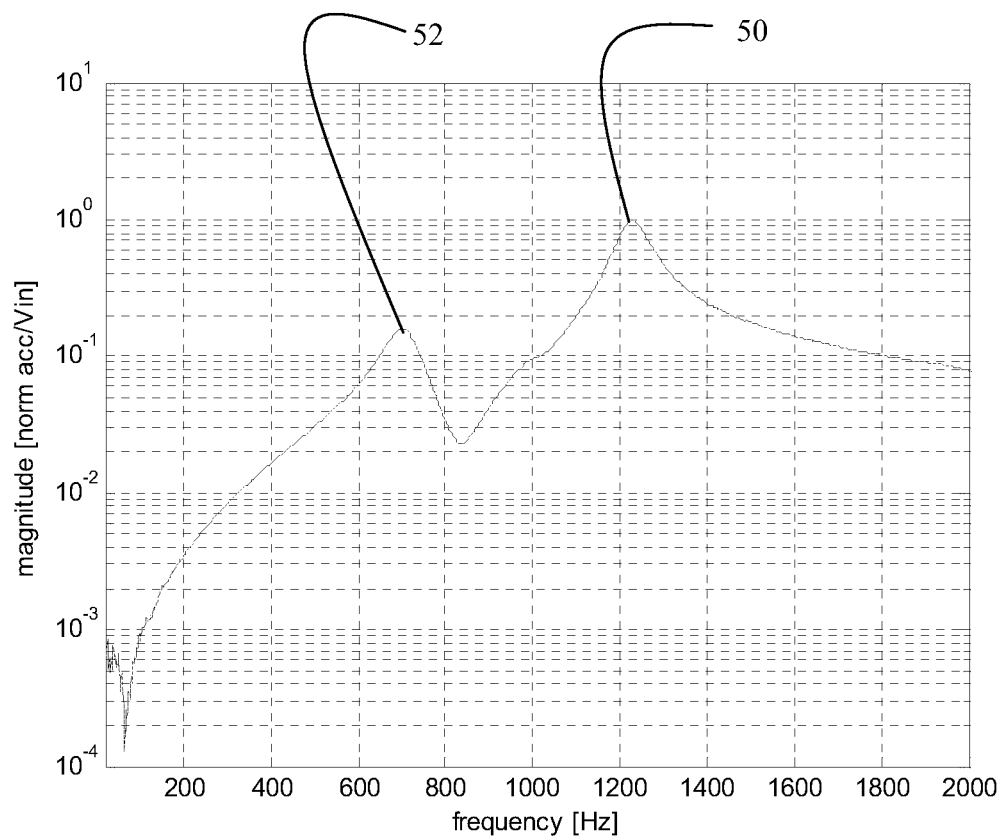
FIG. 7 is a graph of the amplification transfer function of the exemplary synthetic jet.

As shown in FIGS. 2 and 3, a piston 40 may be attached to the center shaft 18 for use in a synthetic jet generator. FIGS. 5 and 6 show an exemplary implementation for a synthetic jet having a housing 42 with a cavity receiving the piston 40 and an outlet orifice 44. The housing 42 includes a support ring 46 which engages the attachment brackets 14a and 14b to support the amplification structure frame 10. A centering bearing 38 received in a sleeve in a superstructure (not shown) attached to the housing 42 may be employed on the center shaft 18 to maintain axial alignment during longitudinal reciprocation of the shaft or alternatively to provide a second motion output for the amplification structure frame. Sizing of the cavity 46 into which the piston is received including relative area between the piston and outlet orifice creates acoustic modes within the cavity which further amplify the mechanical actuation provided by the amplification structure frame 10. Through coupling of the acoustic mode of the cavity, piston and outlet orifice the synthetic jet actuator may be driven at either the mechanical or acoustic resonance of the device. A measured transfer function of the device shown in FIGS. 5 and 6 between voltage into the piezoceramic actuation assembly 26 and the acceleration of the piston 40 is shown in FIG. 7. In this example, the total displacement amplification of the piston at the measured peak 50 at around 1200 Hz is a factor of 10 over the motion of the piezoceramic stack alone. A lower frequency peak 52 is associated with uncoupled acoustic resonance while the higher frequency peak 50 is associated with uncoupled structural resonance. In a coupled device, both structural and acoustic effects are involved in both resonances, but the lower frequency peak gives more momentum in the example embodiment. The ability of the improved synthetic jet to tailor the displacement amplification of the piezoceramic stacks while minimizing the mass that is subject to mechanical amplification (with the actuation assembly 26 held stationary and translation of the center shaft only) allows a device that imparts greater forces resulting in higher velocities of air through the orifice. For the example embodiment depicted by the data in FIG. 7, with an initial extension angle 22 for the actuation beam pairs of 8° mechanical amplification was factor of ~3 and an area ratio of piston 40 to outlet orifice 44 of approximately 100 produced resonant amplification of approximately 5. With initial extension angle 22 in a range of about 5° to 15° mechanical amplification of at least a factor of 5 is anticipated with varied area ratio from about 100 to 50.

Figure 8:
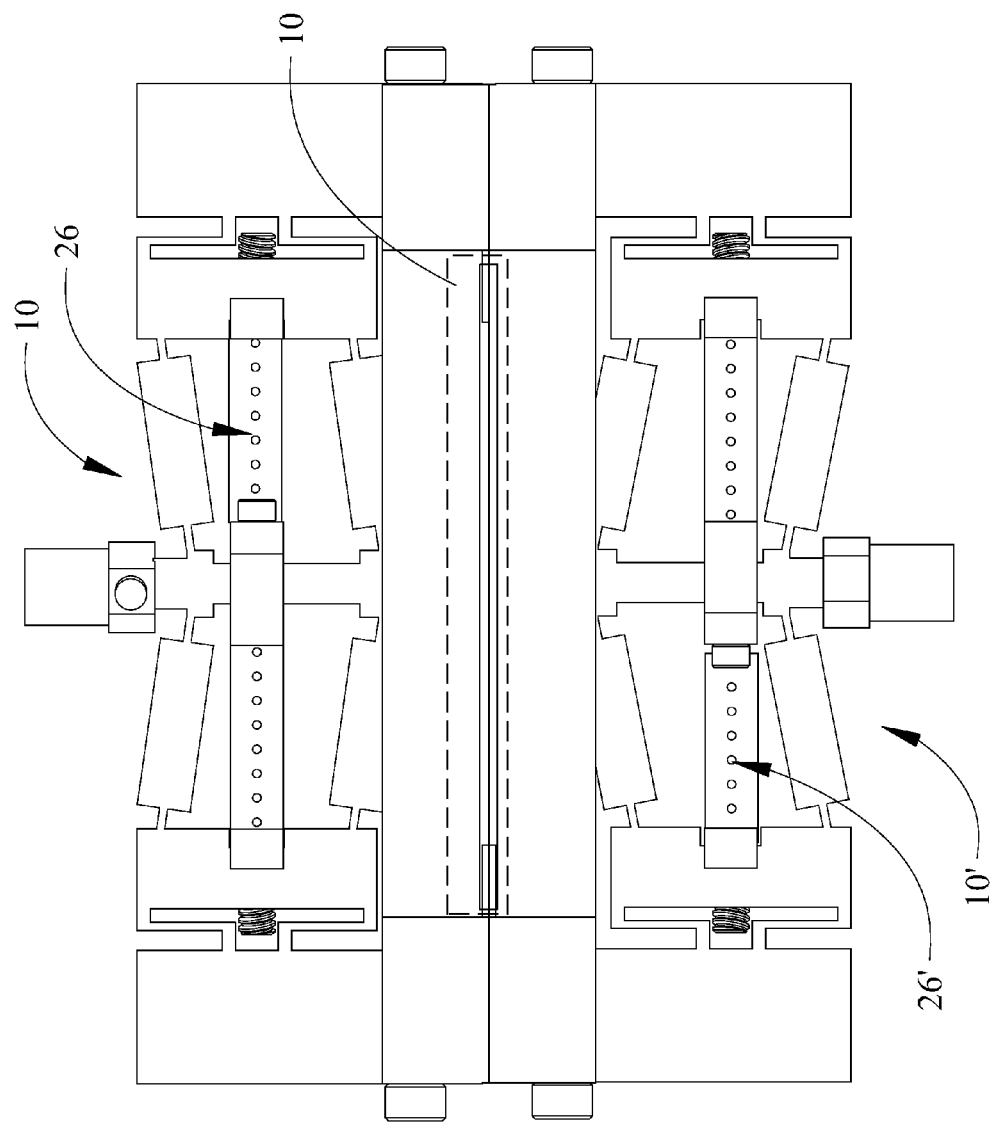
FIG. 8 is a side section view of two opposed mechanical amplification system of the described embodiment driving a single piston for a synthetic jet; and, FIG. 9 is a flow chart of a method for creation of a synthetic jet employing coupled amplification of a piezoceramic stack.

The stationary positioning of the actuation assembly 26 for the embodiment shown in FIGS. 5 and 6 enhances the ability to employ two opposed amplification frames 10 and 10' to drive a single piston 40 as shown in FIG. 8 with actuation of the piezoelectric actuation assemblies 26 and 26' out of phase.

Figure 9:
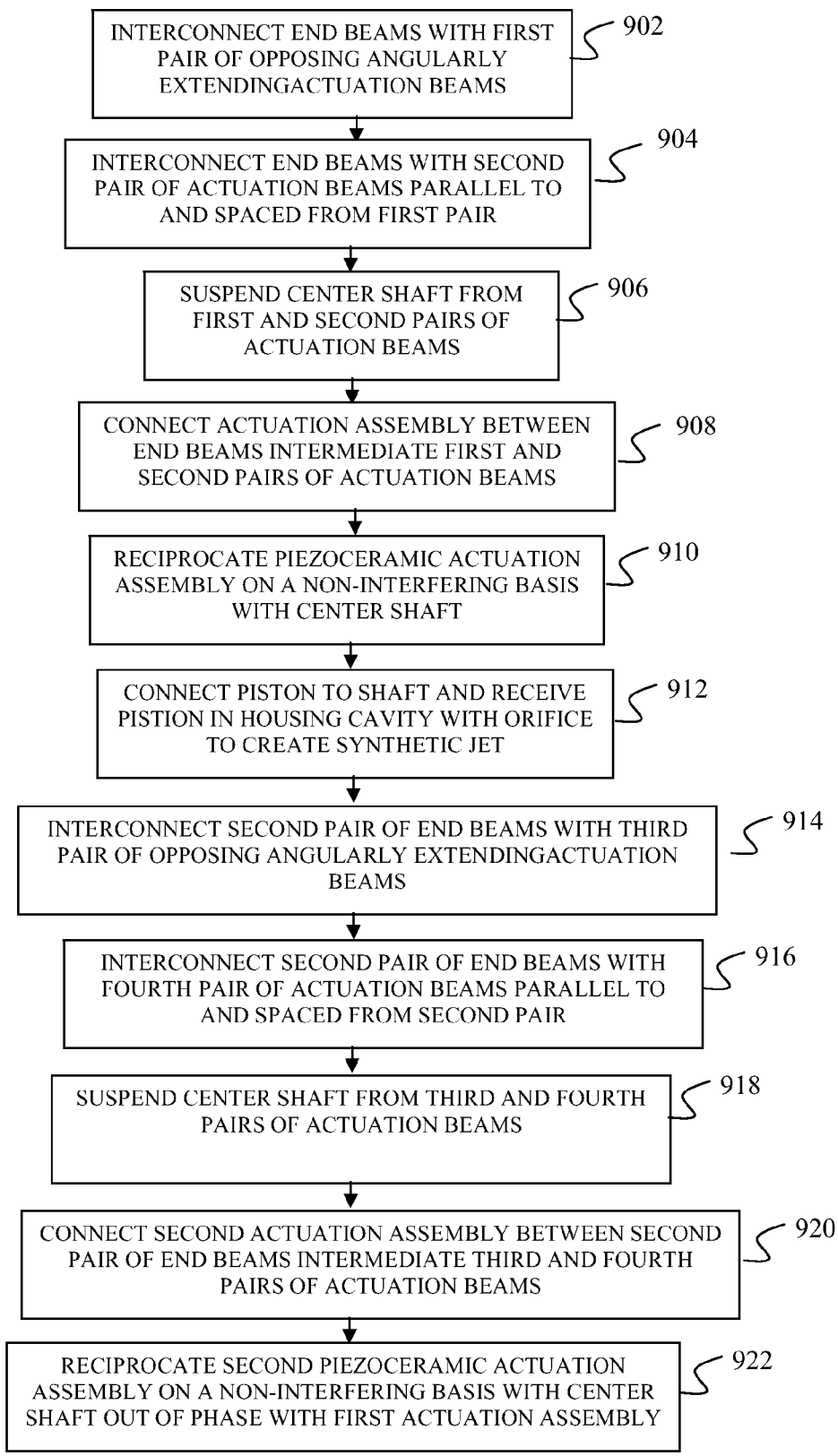

The embodiments described herein provide a method for amplifying the mechanical actuation of a piezoceramic actuator assembly for use in a synthetic jet or other applications as shown in FIG. 9 Laterally spaced flexing end beams are interconnected with a first pair of opposing actuation beams angularly extending from the end beams, step 902, and a second pair of opposing actuation beams extending angularly from the end beams, parallel to and longitudinally spaced from the first pair of opposing actuation beams, step 904. A center shaft with a piston is suspended from the first pair of opposing actuation beams and the second pair actuation beams, step 906. A piezoceramic actuation assembly is connected between the end beams and intermediate the first and second pair of actuation beams, step 908. The piezoceramic actuation assembly is reciprocated on a non-interfering basis with the center shaft, step 910. Achieving the non-interfering condition between the actuation assembly and the center shaft may be accommodated by inserting the center shaft through a collar interconnecting two piezoceramic stacks in the piezoceramic actuation assembly. The piston is connected to the center shaft and received in a housing cavity having an orifice to create the synthetic jet, step 912. The reciprocation of the piezoceramic actuation assembly may occur at a first frequency to provide a coupled mechanical resonance of the acoustic cavity for increased amplification. The reduced reciprocating mass also allows the operation at a second frequency for coupled resonance of the piston for increased amplification.

Operation with a second actuation frame as shown in FIG. 8 is accomplished by interconnecting a second pair of laterally spaced flexing end beams with a third pair of opposing actuation beams extending at an inverse angle from the pair of end beams, step 914, and a fourth pair of opposing actuation beams extending at an inverse angle from the second pair of end beams, parallel to and longitudinally spaced from the third pair of opposing actuation beams, step 916. The center shaft with the piston is then also suspended from the third pair of opposing actuation beams and the fourth pair actuation beams, step 918. A second piezoceramic actuation assembly is connected between the second pair of end beams and intermediate the third and fourth pair of actuation beams, step 920 and reciprocated on a non-interfering basis with the center shaft out of phase with the first piezoceramic actuation assembly, step 922.

Having now described various embodiments of the disclosure in detail as required by the patent statutes, those skilled in the art will recognize modifications and substitutions to the specific embodiments disclosed herein. Such modifications are within the scope and intent of the present disclosure as defined in the following claims.

What is claimed is:

1. A synthetic jet actuation structure comprising:
    an amplification structure frame having
        laterally spaced flexing end beams rigidly attached to a housing,
        a first pair of opposing actuation beams angularly extending from the end beams,
        a second pair of opposing actuation beams extending angularly from the end beams, parallel to and longitudinally spaced from the first pair of opposing actuation beams,
        a center shaft suspended by the first pair of opposing actuation beams and the second pair actuation beams,
    a piezoceramic actuation assembly extending between the end beams in a non-interfering relationship with the center shaft, said piezoceramic actuation assembly having a first condition placing the end beams in a first relative lateral position with the first pair of actuation beams extending at a first angle from the end beams and the second pair of actuation beams also extending at the first angle from the end beams to place the shaft in a first longitudinal position and a second condition placing the end beams in a second relative lateral position with the first pair of actuation beams extending at a second angle from the end beams and the second pair of actuation beams also extending at the second angle from the end beams to place the shaft in a second longitudinal position;
    a piston connected to the center shaft; and,
    the housing having a cavity receiving the piston and an orifice providing an output from the cavity.

2. The synthetic jet actuation structure as defined in claim 1 wherein the piezoceramic actuation assembly comprises a pair of piezoceramic stacks each connected at an inner end to a collar and at an opposite end to a respective one of the end beams, said center shaft extending through said collar.

3. The synthetic jet actuation structure as defined in claim 1 further comprising attachment brackets securing the end beams to the housing.

4. The synthetic jet actuation structure as defined in claim 1 wherein the piston is connected to a first end of the center shaft and further comprising a centering bearing attached to the second end of the center shaft for maintaining axial alignment during reciprocation of the shaft.

5. The synthetic jet actuation structure as defined in claim 1 wherein the actuation beams are attached by flexible webs machined or etched between the end beams and actuation beams and the center shaft and actuation beams.

6. The synthetic jet actuation structure as defined in claim 1 wherein the amplification structure frame is fabricated from a material selected from the set of aluminum, beryllium, beryllium alloys, titanium, steel and carbon fiber reinforced plastic.

7. The synthetic jet actuation structure as defined in claim 1 wherein the piezoceramic actuation assembly is operable between the first and second conditions at a first frequency to provide a mechanical resonance of the shaft for increased amplification.

8. The synthetic jet actuation structure comprising:
    an amplification structure frame having
        laterally spaced flexing end beams,
        a first pair of opposing actuation beams angularly extending from the end beams,
        a second pair of opposing actuation beams extending angularly from the end beams, parallel to and longitudinally spaced from the first pair of opposing actuation beams,
        a center shaft suspended by the first pair of opposing actuation beams and the second pair actuation beams,
    a piezoceramic actuation assembly extending between the end beams in a non-interfering relationship with the center shaft, said piezoceramic actuation assembly having a first condition placing the end beams in a first relative lateral position with the first and second pair of actuation beams extending at a first angle from the end beams to place the shaft in a first longitudinal position and a second condition placing the end beams second relative lateral position with the first and second air of actuation beams extending at a second angle from the end beams to place the shaft in a second longitudinal position, the piezoceramic actuation assembly operable between the first and second conditions at a first frequency to provide a mechanical resonance of the shaft for increased amplification;
    a piston connected to the center shaft; and,
    a housing having a cavity receiving the piston and an orifice providing an output from the cavity,
wherein a volume of the cavity, a piston area and an orifice area are sized for acoustic resonance at a second frequency of operation of the piezoceramic actuation assembly between the first and second conditions.

9. The synthetic jet actuation structure as defined in claim 8 wherein the acoustic resonance and mechanical resonance are coupled for enhanced amplification.

* * * * *